(12) United States Patent
Arao

(10) Patent No.: US 6,432,620 B1
(45) Date of Patent: Aug. 13, 2002

(54) EDGE RINSE APPARATUS AND EDGE RINSE METHOD

(75) Inventor: Tatsuya Arao, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 72 days.

(21) Appl. No.: 09/640,303

(22) Filed: Aug. 16, 2000

(30) Foreign Application Priority Data

Aug. 24, 1999 (JP) ............................................. 11-236744

(51) Int. Cl.[7] .................................................. G03F 7/30

(52) U.S. Cl. ..................... 430/322; 430/327; 430/311

(58) Field of Search ................................ 430/322, 327, 430/328, 329, 331, 311; 134/153, 154, 157

(56) References Cited

U.S. PATENT DOCUMENTS 5,993,547 A * 11/1999 Sato ............................. 118/50
6,240,874 B1 * 6/2001 Pike ............................ 118/666

\* cited by examiner

*Primary Examiner*—Kathleen Duda
(74) *Attorney, Agent, or Firm*—Cook, Alex, McFarron, Manzo, Cummings & Mehler, Ltd.

(57) ABSTRACT

There is provided an edge rinse apparatus and an edge rinse method in which a swelling of an end portion of a resist produced by an edge rinse is eliminated. The resist coated on an unnecessary portion is exposed and is developed by using the edge rinse apparatus including a substrate chuck for sucking and holding a substrate, a motor for rotating the substrate chuck, a nozzle for discharging a developing solution to a principal surface of the substrate, a nozzle for discharging the developing solution to a rear surface of the substrate, and an exposure means with the substrate chuck as a mask.

12 Claims, 7 Drawing Sheets

EDGE RINSE APPARATUS AND EDGE RINSE METHOD

BACKGROUND OF THE INVENTION

1. Field of the Invention

The present invention relates to an edge rinse after resist is coated on a substrate, and particularly to an apparatus (edge rinse apparatus) for removing resist coated on a peripheral portion of a principal surface of a substrate, an end surface of the substrate, and a rear surface of the substrate, and a method (edge rinse method) of removing the resist. In the present specification, every apparatus having the function of making the edge rinse is called the edge rinse apparatus.

2. Description of the Related Art

In various fields, a pattern is formed on a substrate by a lithography technique using resist. Particularly, this is an inevitable technique when an element using semiconductor, for example, a thin film transistor (hereinafter referred to as a TFT) is fabricated.

The lithography technique is used for fabrication of a display device using a glass substrate, for example, a liquid crystal display device, a plasma display panel (PDP), an EL (Electroluminescence) display device, an FED (Field Emission Display), etc., or fabrication of an image sensor using a CCD, CMOS, etc. In the present specification, the resist indicates a positive resist which comes to have solubility to a developing solution when light (visible light or ultraviolet rays) or X-rays are irradiated.

As a coating method of resist, a rotation coating method using a spin coater is generally used. That is, after the resist is dropped onto the principal surface of a substrate, the substrate is rotated, so that the resist is applied by generated centrifugal force to form a coating film of uniform thickness. However, since the resist rounds to the end surface of the substrate and the rear surface of the substrate at the same time, it is coated on not only the principal surface of the substrate but also the end surface of the substrate and the rear surface of the substrate. In order to prevent raising dust and pollution to a conveyance system, etc., it has been necessary to make a removal of the resist coated on the peripheral portion of the principal surface of the substrate, the end surface of the substrate, and the rear surface of the substrate (hereinafter, they are together referred to as an unnecessary portion), a so-called edge rinse. In the present specification, the principal surface of the substrate means a surface having an object to be processed on which a pattern is formed.

As a method of the edge rinse, there are known a method of rotating a substrate while a washing solution is discharged to the rear surface of the substrate, and a method of moving a recess portion for discharging a washing solution to an unnecessary portion and a washing nozzle having the function of sucking and removing a dissolved resist or the like. Here, as the washing solution, a solution which easily dissolves the resist is used. However, these methods have problems as set forth below.

First, the state of a substrate after processed by the conventional edge rinse method is shown in FIG. 9. In FIG. 9, a resist 902 exists on a substrate 901, and a resist on an unnecessary portion, that is, a substrate principal surface peripheral portion 903, a substrate end surface 904, and a substrate rear surface 905 is removed. Here, although the resist coated on the unnecessary portion is dissolved and removed by a washing solution, since the resist dissolved by the washing solution is accumulated at an end 906 of the resist, a swelling of the resist is produced as shown in FIG. 9.

Since the resist is hardened or its quality is changed through baking and doping steps, it becomes difficult to remove this swelling by ashing, and a resist residue is liable to be produced at the end of the substrate. Then, the yield is lowered by raising dust due to peeling of the resist residue, or a step of removing the resist residue becomes necessary. Further, in this swelling, when exposure or ion implantation is carried out, foaming is liable to occur by gas generated in the resist film, and wastes due to a cause different from the foregoing raising dust are also produced.

Besides, since a wet etching by a washing solution is made as a base, it is difficult to uniformly control the distance from the substrate end of the substrate principal surface peripheral portion, and the resist end has been irregular. Besides, the washing solution rebounds on a cup and is splashed on a necessary portion (region where a pattern is formed), so that the resist of the necessary portion is partially dissolved and poor pattern formation occurs.

SUMMARY OF THE INVENTION

An object of the present invention is to provide an edge rinse apparatus and an edge rinse method which solve the foregoing problems.

According to an aspect of the invention, an edge rinse apparatus includes a substrate chuck for sucking and holding a substrate, a motor for rotating the substrate chuck, a nozzle for discharging a developing solution to a principal surface of the substrate, a nozzle for discharging the developing solution to a rear surface of the substrate, and exposure means with the substrate chuck as a mask.

According to another aspect of the invention, an edge rinse apparatus includes a substrate chuck for sucking and holding a substrate, a motor for rotating the substrate chuck, a nozzle for discharging a developing solution to a principal surface of the substrate, a nozzle for discharging the developing solution to a rear surface of the substrate, a radiant energy source, and a transmission window through which radiant energy from the radiant energy source is transmitted.

According to still another aspect of the invention, an edge rinse apparatus includes a substrate chuck for sucking and holding a substrate, a motor for rotating the substrate chuck, a nozzle for discharging a developing solution to a principal surface of the substrate, a nozzle for discharging the developing solution to a rear surface of the substrate, a radiant energy source, and a reflecting mirror for reflecting radiant energy from the radiant energy source.

According to still another aspect of the invention, an edge rinse apparatus includes a substrate chuck for sucking and holding a substrate, a motor for rotating the substrate chuck, a nozzle for discharging a developing solution to a principal surface of the substrate, a nozzle for discharging the developing solution to a rear surface of the substrate, a radiant energy source, and an optical fiber having a cut, and the optical fiber transmits radiant energy from the radiant energy source.

According to still another aspect of the invention, an edge rinse apparatus includes a substrate chuck for sucking and holding a substrate, a motor for rotating the substrate chuck, a nozzle for discharging a developing solution to a principal surface of the substrate, a nozzle for discharging the developing solution to a rear surface of the substrate, and a radiant energy source, and the substrate chuck includes a waveguide for radiant energy from the radiant energy source.

According to still another aspect of the invention, an edge rinse method for edge-rinsing a substrate coated with a resist includes a step of exposing the resist from a rear surface of the substrate using a substrate chuck as a mask, and a step of developing the exposed resist.

According to still another aspect of the invention, an edge rinse method for edge-rinsing a substrate coated with a resist includes a step of discharging a developing solution to a rear surface and a principal surface of the substrate while the resist is exposed from the rear surface of the substrate using a substrate chuck as a mask, and developing the exposed resist.

DETAILED DESCRIPTION OF THE PREFERRED EMBODIMENTS

[Embodiment Mode]

Figures 1A, 1B:
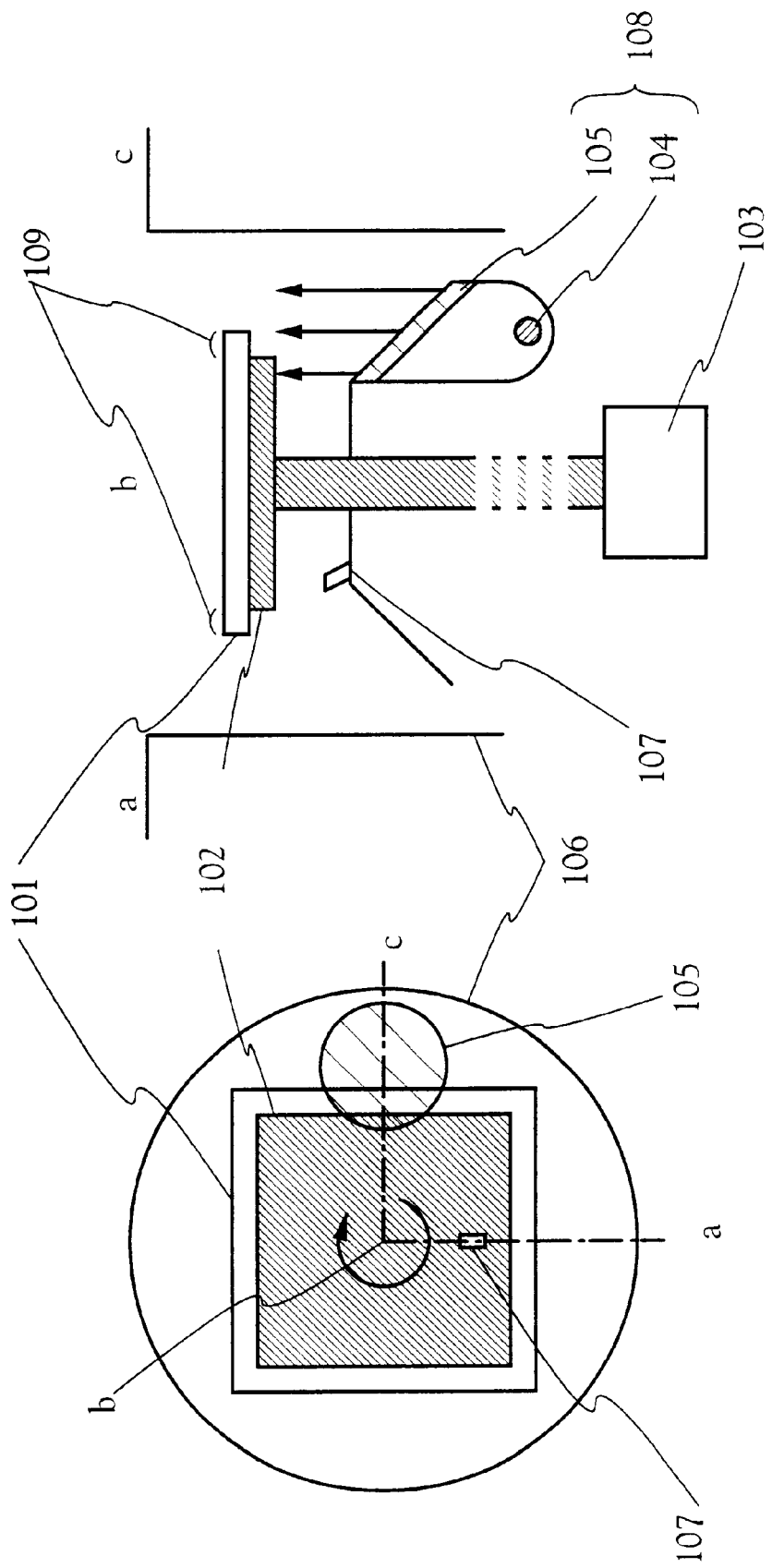
FIGS. 1A and 1B are schematic views of an edge rinse apparatus of the present invention.

FIGS. 1A and 1B are schematic views of an edge rinse apparatus of the present invention. FIG. 1A is a top view of the edge rinse apparatus, and FIG. 1B is a sectional view taken along the line a-b-c of FIG. 1A.

The edge rinse apparatus employs a spinner including a substrate chuck 102 for vacuum sucking and holding a substrate 101, a motor 103 for rotating the substrate chuck, and a cup 106 for preventing a developing solution or pure water from splashing, and further, the edge rinse apparatus includes exposure means 108 for exposing the substrate from its rear surface, a back rinse nozzle 107 for discharging a developing solution to the rear surface of the substrate, and a not-shown development nozzle for discharging the developing solution to a principal surface of the substrate.

Although washing the developing solution and the dissolved resist attached to the substrate after development may be carried out by another washing apparatus, if a pure water nozzle for discharging pure water to the principal surface of the substrate and a pure water nozzle for discharging pure water to the rear surface are provided in the edge rinse apparatus, washing of the developing solution can also be made at the same time.

The material of the substrate 101 is not particularly limited as long as radiant energy can be transmitted through the material. Typically, glass, quartz, plastic, or the like can be enumerated. In the case where the present invention is carried out in a fabricating process of a display device or an image sensor, the substrate itself naturally transmits the radiant energy, and further, it is necessary to prevent a peripheral portion of the substrate principal surface from being shaded by forming a film of a material to block out the radiant energy, for example, metal or the like on the substrate in another step. For that purpose, in order that a film is not formed on the substrate principal surface peripheral portion when the film is formed, it becomes necessary to provide a shield (made of, for example, metal or ceramic) at the substrate principal surface peripheral portion on a substrate support of a film formation apparatus.

The motor for rotating the substrate chuck is not limited to specific means. For example, an AC servo motor, a DC servo motor, a step motor, a parametric motor, an ultrasonic motor, a heat magnetic motor, an optical motor, or the like can be used, and the AC servo motor is generally used.

In FIG. 1, the exposure means 108 is constructed by a radiant energy source 104 (general term for a light source or X-ray source suitably selected according to the kind of resist) and a transmission window 105 through which light or X-rays from the radiant energy source is transmitted. The transmission window is not particularly limited as long as it has a shape capable of exposing the resist of an unnecessary portion.

Figure 2:
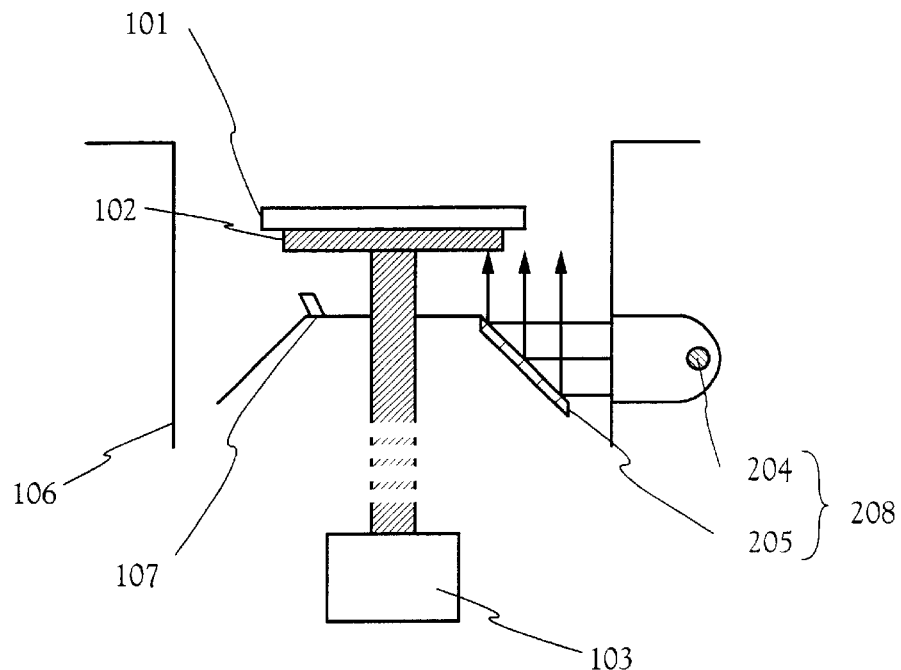
FIG. 2 is a schematic view of an edge rinse apparatus of the present invention.
Figure 3:
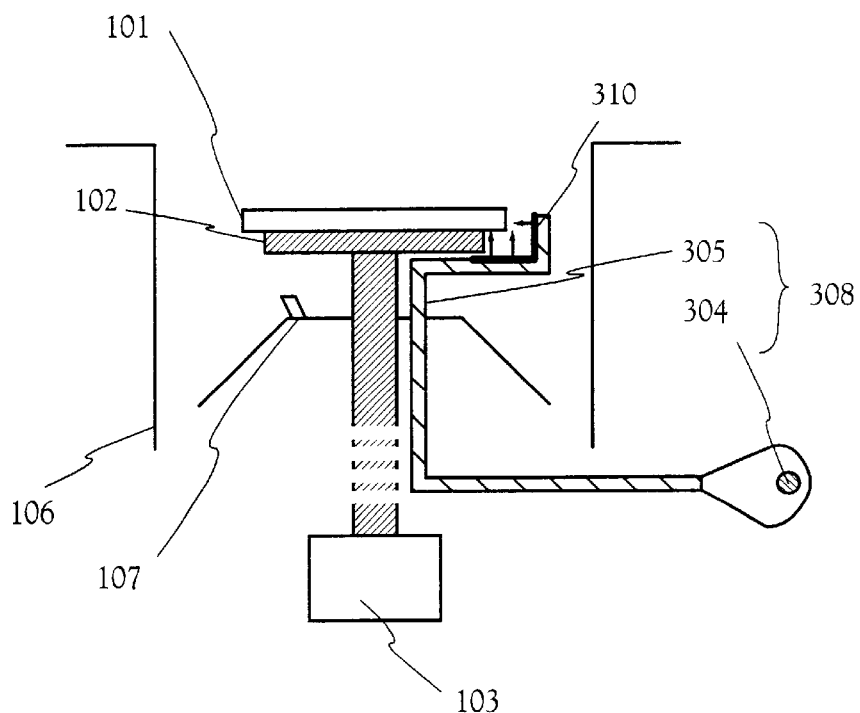
FIG. 3 is a schematic view of an edge rinse apparatus of the present invention.
Figure 4:
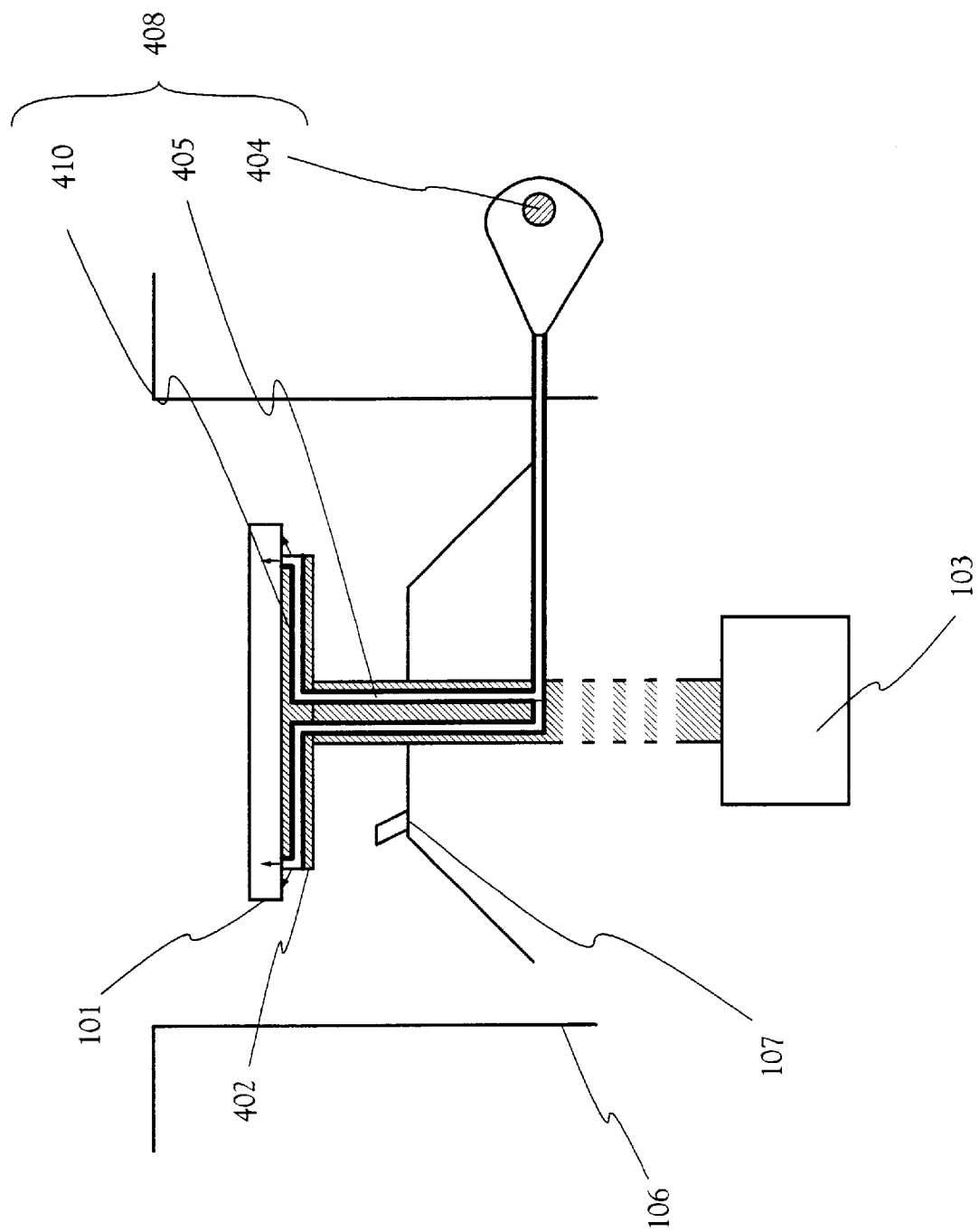
FIG. 4 is a schematic view of an edge rinse apparatus of the present invention.

As another exposure means, structures shown in edge rinse apparatuses of FIGS. 2 to 4 can be used. An exposure means 208 of FIG. 2 has a structure in which the resist of the unnecessary portion is exposed by radiant energy from a radiant energy source 204 by using a reflecting mirror 205. As the reflecting mirror, a plane mirror in which a fine anneal product of commercially available Pyrex glass is provided with a UV reflection reinforced aluminum coat, may be used. An exposure means 308 of FIG. 3 has a structure in which an optical fiber 305 for transmitting radiant energy from a radiant energy source 304 is provided, and a cut 310 is provided in the optical fiber positioned in the vicinity of the unnecessary portion, so that radiant energy leaks out from the cut and the resist of the unnecessary portion is exposed. In FIG. 4, a waveguide for radiant energy is provided in a substrate chuck 402, and radiant energy from a radiation energy source 404 is radiated at the end of the substrate chuck, so that the resist of the unnecessary portion is exposed. The waveguide for radiant energy in FIG. 4 may be a combination of a material 405 for transmitting the radiant energy and a material 410 for reflecting the radiant energy, for example, aluminum protected with a dielectric multi-layer film, or may have a structure similar to an optical fiber in which a core portion having high reflectivity is sandwiched between cladding portions having low reflectivity.

In the case where a light source is used as the radiant energy source 104, 204, 304 or 404, the g line (wavelength of 436 nm), h line (wavelength of 405 nm), or i line (365 nm) of a mercury lamp, a KrF excimer laser (wavelength of 248 nm), an ArF excimer laser (wavelength of 193 nm), or the like may be used as the radiant energy source. As the transmission window 105 or the transmission material 405, quartz, sapphire, organic resin, or the like may be used. In the case where an X-ray source is used as the radiant energy source 104, 204, 304 or 404, a synchrotron radiant light or the like can be used as the radiant energy source. As the transmission window 105 or the transmission material 405, beryllium (Be), diamond or the like can be used.

The substrate chuck 102 or 402 has a size comparable to the substrate except a substrate principal surface peripheral portion 109, and it is possible to use metal, ceramic, resin or the like which can block out the radiant energy from the radiant energy source. In the case where metal is used as the material for blocking out the radiant energy, in order to prevent deterioration or diffusion of metal, it is preferable to coat the surface with an organic resin or inorganic material.

The substrate principal surface peripheral portion 109 may be suitably determined in view of the size of the substrate, and the state of contact with a conveyance arm, positioning portion or the like. In this specification, a substrate of five inches in square is used, and the substrate principal surface peripheral portion is 1 mm to 10 mm, preferably 2 mm to 6 mm, a target value of 3.5 mm from the end surface of the substrate. However, the invention is not limited to this numerical values.

The exposure means 108, 208, 308, or 408 is used, and exposure is made from the rear surface of the substrate using the substrate chuck as a mask, so that the resist coated on the unnecessary portion of the substrate is exposed.

Development is made by using a developing solution during the exposure or after the exposure, so that the resist coated on the unnecessary portion of the substrate is dissolved in the developing solution and is removed. Like this, the resist which can be used in the present invention is limited to a positive resist in which an exposed portion of the resist becomes soluble in the developing solution.

When the development is made while the exposure is made, a resist residue can be prevented. In this case, in order to prevent the irradiated radiant energy from being scattered or attenuated by the splashing developing solution, as shown in FIG. 1A, a back rinse nozzle 107 is disposed at a downstream side in the rotating direction (direction shown by an arrow in FIG. 1A) as compared with a position (position of the transmission window 105 in FIG. 1A) where the exposure means is disposed, so that the developing solution can be scattered to the position of the exposure means. Of course, the not-shown development nozzle is also disposed similarly to the back rinse nozzle. However, when the development is made while exposuring, there is a fear in that the radiant energy is reflected and diffused by the developing solution flowing on the surface of the principal substrate, the resist of the necessary portion is exposed.

In the case where development is made by using a developing solution after exposure, since the radiant energy is absorbed by the exposed resist, a resist residue is liable to be produced especially on the substrate principal surface peripheral portion, and therefore, it is desirable to make the exposure for a sufficiently long time. However, if an attempt to complete the edge rinse by one exposure is made, a processing time becomes long and productivity is lowered. Thus, if an operation in which irradiation of radiant energy is stopped after an exposure of a short time and development by a developing solution is made (hereinafter, this operation is called an exposure-development operation), is repeated at least twice, lowering of productivity can be eased, and it is possible to prevent the resist residue and the exposure of the resist of the necessary portion. However, if this operation is repeated, since consumption of the developing solution becomes larger, it is preferable to use a recycling system of the developing solution.

As the resist, various positive resists can be used, and a solution suitable for each resist may be used for the developing solution. For example, diazonaphthoquinone-novolac resin (developing solution is TMAH (Tetramethylammonium hydroxide)), polymethyl metacrylate (developing solution is a solution of methyl isobutyl ketone:isopropyl alcohol of 1:3), copolymer of alpha-methyl styrene-alpha-chloroacrylate (developing solution is mixed xylene), or the like can be used as the resist.

The developing solution is discharged to the principal surface and the rear surface of the substrate from the not-shown development nozzle and the back rinse nozzle 107. Since the resist of the portion not exposed is insoluble to the developing solution, the developing solution discharged to the principal surface of the substrate dissolves the exposed resist on the substrate principal surface peripheral portion and the substrate end surface. The developing solution discharged to the substrate rear surface dissolves the resist on the substrate rear surface and the substrate end surface. Here, according to the position of the back rinse nozzle, there is a case where the developing solution is discharged to the substrate chuck, and the resist residue can occur at the substrate rear surface. However, by making the revolution speed of the substrate slow, it is possible to make the developing solution round from the substrate principal surface, and this problem can be solved. Of course, it is also possible to solve this problem by contriving the position and the shape of the back rinse nozzle so that the developing solution can be discharged to the substrate rear surface.

As the development nozzle for discharging the developing solution to the substrate principal surface, a nozzle generally used in a spin developer (an apparatus for performing development, washing, and drying by rotating the substrate) can be used.

Besides, in order to prevent the resist coated on the necessary portion from being exposed by rounding of the radiant energy, an upper portion of the cup 106 of the edge rinse apparatus is opened. Thus, even if the radiant energy is reflected by the cup, it is radiated to the upper portion as it is, and it is possible to prevent rounding to the necessary portion. If an anti-reflection film is provided on the cup, the reflection itself can be reduced, which is more preferable. As the anti-reflection film, it is possible to use organic resin containing a pigment having sufficient absorption coefficient to radiant energy.

Besides, in order to prevent the radiant energy radiated from the upper opening of the cup from being reflected by the ceiling of the apparatus, it is also preferable to provide an anti-reflection film on the ceiling as well.

Even when the cup has a cover at the upper portion, it can be used by providing an anti-reflection film on the inner surface of the cover.

Figure 5:
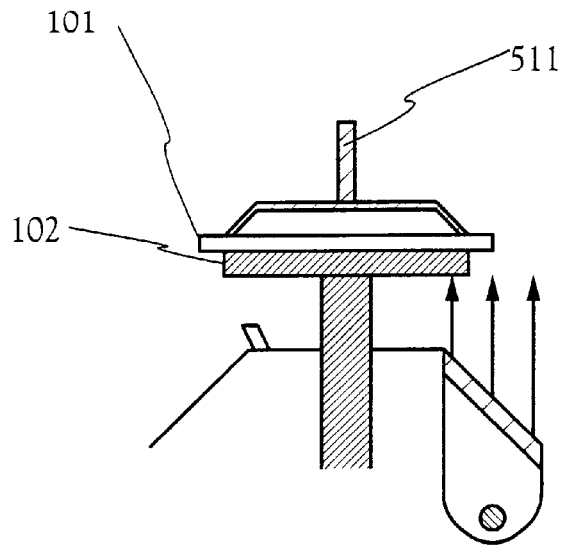
FIG. 5 is a view showing an example of a method of preventing rounding of radiant energy of the present invention.
Figure 6:
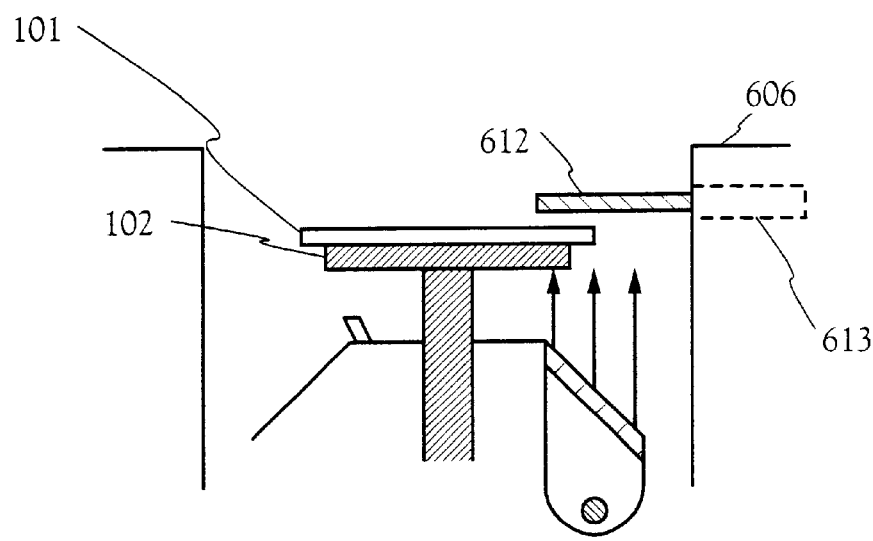
FIG. 6 is a view showing an example of a method of preventing rounding of radiant energy of the present invention.

However, since there is a case where radiant energy is scattered by the unevenness of the cup or the ceiling and rounding occurs, it is effective to use a method as shown in FIG. 5 or 6 as a preventing method of rounding of the radiant energy.

FIG. 5 shows a structure of preventing the rounding of the radiant energy by disposing a light shielding cover 511 made of a material capable of blocking out the radiant energy, for example, metal, ceramic, resin or the like over the substrate 101. The light shielding cover is in contact with the substrate at only the end of the light shielding cover, and is rotated together with the substrate. By adopting this structure, it is possible to completely prevent the radiant energy from penetrating into the inside of the light shielding cover. At the rotation together with the substrate, if the inside pressure of the light shielding cover is slightly decreased, the light shielding cover is sucked to the substrate, and the rotation becomes easy. At the minimum, the size sufficient to cover the resist of the necessary portion is required for the light shielding cover, and concretely, the size is made equal to the substrate chuck 102 or smaller than it by about 2 mm.

Besides, FIG. 6 shows a structure for preventing the rounding of the radiant energy by providing a light shielding plate 612 for blocking out the radiant energy transmitted through the substrate 101. The light shielding plate is contained in an accommodation portion 613 of a cup 606 when the substrate is mounted or taken out, and the light shielding plate is moved to a position above the substrate to block out the radiant energy when exposure for an edge rinse is made. The size of the light shielding plate 612 is slightly larger than the irradiation area of the radiant energy, and metal, ceramic, resin or the like which can block out the radiant energy may be used as the material. It is preferable that the distance between the substrate and the light shielding plate is 5 to 30 mm, especially 10 to 20 mm. It is more effective to form an anti-reflection film on the light shielding plate.

Although the mode of the edge rinse apparatus has been described, a concrete structure of the edge rinse apparatus and an edge rinse method will be described in the following embodiments.

First, in embodiments 1 to 4, examples of the edge rinse apparatus of the present invention will be described, and in embodiment 5 and the following, a method of making an edge rinse by using the edge rinse apparatus of the present invention will be described.

[Embodiment 1]

An example of the edge rinse apparatus of the present invention will be described below with reference to FIGS. 1A and 1B. FIG. 1A is a top view of the edge rinse apparatus, and FIG. 1B is a sectional view taken along the line a-b-c of FIG. 1A.

The edge rinse apparatus shown in the embodiment 1 employs a spinner including a substrate chuck 102 for vacuum sucking and holding a substrate 101, a motor 103 for rotating the substrate chuck, in this embodiment, an AC servo motor, and a cup 106 for preventing a developing solution or pure water from splashing, and further, the edge rinse apparatus includes exposure means 108 for exposing the substrate from its rear surface, a back rinse nozzle 107 for discharging a developing solution to the rear surface of the substrate, and a not-shown development nozzle for discharging the developing solution to a principal surface of the substrate. Besides, the apparatus includes a pure water nozzle for discharging pure water to the principal surface of the substrate and a pure water nozzle for discharging pure water to the rear surface.

In FIG. 1, the exposure means 108 is constructed by a radiant energy source 104 and a transmission window 105. In this embodiment, a light source (i line (wavelength of 365 nm) of a mercury lamp) is used as the radiant energy source, and quartz of a diameter of 45 mm is used for the transmission window.

Assuming that a substrate chuck 102 uses a glass substrate having a size comparable to the substrate except a substrate principal surface peripheral portion 109 (in this embodiment, 3.6 mm), in this embodiment, the glass substrate of 126.6 mm×126.6 mm, the substrate chuck is made a size of 123 mm×123 mm, and a material capable of blocking out the radiant energy from the radiant energy source, in this embodiment, Teflon with UV absorption coating is used.

Of course, the substrate is not limited to a rectangle, and when a circular substrate, for example, a glass substrate of a diameter of 20 cm is used, a circular substrate chuck of a diameter of 19 cm to 19.9 cm may be used. When the circular substrate is used, since a region where radiant energy is irradiated is not changed by rotation, there is a merit that the irradiation region of the radiant energy can be lessened.

A resin dispersed with carbon black as an anti-reflection film is formed at the inside of the cup 106 and a not-shown ceiling of the apparatus. Further, a structure shown in FIG. 5 or 6 may be added to prevent rounding.

As shown in FIG. 5, when a light shielding cover 511 sucked to the substrate is provided over the substrate 101, rounding of light can be completely prevented. As the light shielding cover 511, a material for blocking out the radiant energy may be used, and it is easy to use the same material as the substrate chuck 102. When used in this embodiment, the light shielding cover of Teflon with UV absorption coating of 122 mm×122 mm is used.

Besides, as shown in FIG. 6, when a light shielding plate 612 provided with an anti-reflection film on a surface opposite to the substrate 101 is provided in a cup 606 radiant energy transmitted through the substrate is blocked by the light shielding plate at the exposure for the edge rinse, so that rounding of light can be prevented. In the light shielding plate, it is effective to provide the anti-reflection film or UV absorption coating of a material blocking out the radiant energy on the surface opposite to the substrate. It is preferable that the distance between the substrate and the light shielding plate is 5 to 30 mm, especially 10 to 20 mm, and in this embodiment, 10 mm.

Since the edge rinse apparatus shown in this embodiment has many portions common to a conventional spin developer, it can be easily obtained by simple modification, and an occupied area of the apparatus is also hardly changed.

[Embodiment 2]

An edge rinse apparatus of this embodiment is different from that of FIG. 1 in the structure of exposure means, and will be described with reference to FIG. 2. FIG. 2 is a sectional view of the edge rinse apparatus, and structures common to FIG. 1 are designated by the same reference characters as FIG. 1, and are the structures shown in the embodiment 1.

In FIG. 2, exposure means 208 is constructed by a radiant energy source 204 and a reflecting mirror 205. In this embodiment, a light source (i line (wavelength of 365 nm) of a mercury lamp) is used as the radiant energy source. A commercially available reflecting mirror (plane mirror of a fine anneal product of Pyrex glass with a UV reflection reinforced aluminum coat) is used as the reflecting mirror 205. Light emitted from the radiant energy source is reflected by the reflecting mirror, and can expose the resist coated on the unnecessary portion of the substrate from the substrate rear surface. The radiant energy source may be disposed outside of the cup and the reflecting mirror may be irradiated through a not-shown transmission window.

Further, similarly to the embodiment 1, in order to prevent the rounding of the radiant energy, the light shielding cover 511 shown in FIG. 5 or the light shielding plate 612 shown in FIG. 6 may be provided.

In the structure shown in this embodiment, the maintenance of the radiant energy source becomes easy, and it is suitable for disposing cooling means or the like of the radiant energy source.

[Embodiment 3]

An edge rinse apparatus of this embodiment is different from that of FIGS. 1 or 2 in the structure of exposure means, and will be described with reference to FIG. 3. FIG. 3 is a sectional view of the edge rinse apparatus, and structures common to FIG. 1 are designated by the same reference characters as FIG. 1 and are the structures shown in the embodiment 1.

In FIG. 3, exposure means 308 is constructed by a radiant energy source 304 and an optical fiber 305. In this embodiment, a light source (i line (wavelength of 365 nm) of a mercury lamp) is used as the radiant energy source. The optical fiber has a linear cut 310 at a portion in the vicinity of the unnecessary portion of the substrate. The resist coated on the unnecessary portion of the substrate is exposed by light leaking from the cut.

Although the optical fiber of FIG. 3 has such a structure that it is bent along the substrate so that the resist at the substrate end surface is certainly exposed, the optical fiber may be disposed in parallel to the substrate rear surface without bending.

Further, similarly to the embodiment 1, in order to prevent the rounding of radiant energy, the light shielding cover 511 shown in FIG. 5 or the light shielding plate 612 shown in FIG. 6 may be provided.

In the structure shown in this embodiment, since the radiant energy leaks in the vicinity of the substrate, attenuation of the radiant energy is low and the energy can be effectively used. Further, since the radiant energy leaking from the cut is very selectively irradiated to the unnecessary portion, the rounding of the radiant energy can be lessened. Besides, since the radiant energy source can be disposed outside of the apparatus, the maintenance becomes easy, and the structure is suitable for disposing cooling means of the radiant energy source.

[Embodiment 4]

An edge rinse apparatus of this embodiment is different from that of FIGS. 1 to 3 in the structure of exposure means, and will be described with reference to FIG. 4. FIG. 4 is a sectional view of the edge rinse apparatus, and structures common to FIG. 1 are designated by the same reference characters as FIG. 1 and are the structures shown in the embodiment 1.

In FIG. 4, exposure means 408 is provided, in a substrate chuck 402, with a radiant energy waveguide of a material 405 for transmitting radiant energy, in this embodiment, quartz and a material 410 for reflecting the radiant energy, in this embodiment, aluminum protected with a dielectric multi-layer film. In this structure radiant energy from a radiant energy source 404 is radiated at the end of the substrate chuck so that the resist of the unnecessary portion is exposed. In this embodiment, as the radiant energy source, a light source (i line (wavelength of 365 nm) of a mercury lamp) is used.

Further, similarly to the embodiment 1, in order to prevent the rounding of the radiant energy, the light shielding cover 511 shown in FIG. 5 or the light shielding plate 612 shown in FIG. 6 may be provided.

In the structures shown in the embodiments 1 to 3, when attention is paid to one place of the unnecessary portion, it is irradiated only one time per one rotation. However, in the structure shown in this embodiment, since the radiant energy is always irradiated to the resist coated on the unnecessary portion of the substrate, an exposure time can be made short.

Besides, in the apparatus of this embodiment, a method of repeating an exposure-developing operation plural times is more suitable than performing the development during the exposure.

[Embodiment 5]

This embodiment is an example in which in a step of forming a pattern of an object to be processed on a substrate, an edge rinse is made by using the edge rinse apparatus described in the embodiment 1.

First, as a pretreatment for resist coating, a glass substrate of 126.6 mm×126.6 mm having amorphous silicon as an object to be processed is heated in a hexamethyldisilazane (HMDS) vapor up to a temperature not higher than 100° C., in this embodiment, 60° C. so that the surface is made hydrophobic.

Subsequently, by a coating apparatus using a rotation coating method, resist is coated on the object to be processed on the substrate. As the resist, diazonaphthoquinone-novolac resin base resist was used. Thereafter, prebaking at a temperature not higher than 120° C. for 30 to 300 seconds, in this embodiment, prebaking at 110° C. for 90 seconds is carried out, so that remaining solution in the resist is volatilized, the adhesion between the resist and the object to be processed is raised, and the resist characteristics are stabilized.

Then, the glass substrate is carried in the edge rinse apparatus shown in FIG. 1 by a not-shown conveyance means, and the substrate chuck 102 sucks and holds the substrate 101. Positioning between the substrate and the substrate chuck is important at the time of carrying in, and the substrate is carried in so that the substrate principal surface peripheral portion 109 is positioned outside of the substrate chuck.

Here, it is desirable that the size of the substrate chuck in the coating apparatus is equal to or larger than that of the substrate chuck of the edge rinse apparatus. Because, if the size of the substrate chuck of the coating apparatus is smaller than that of the edge rinse apparatus, the resist rounding to the rear surface of the substrate at the time of coating rounds to a region which is in contact with the substrate chuck of the edge rinse apparatus, and the state where the resist is sandwiched between the substrate chuck and the substrate can occur in the edge rinse apparatus. In this state, the resist on the rear surface of the substrate can not be completely removed, and further, there is a possibility that poor suction occurs. In this embodiment, in the coating apparatus, the substrate chuck having the size equal to the substrate chuck of the edge rinse apparatus was used. However, by selecting the revolution speed when the resist is coated, rounding of the resist to the rear surface of the substrate can be almost eliminated. In this case, the substrate chuck of the coating apparatus is not particularly restricted.

While the substrate chuck and the substrate are rotated at 1 to 1000 rpm, in this embodiment, 60 rpm, light of a wavelength of 365 nm is irradiated from the mercury lamp as the radiant energy source 104 at an energy density of 100 mW/cm$^2$ for 15 seconds to the rear surface of the substrate. Here, the exposure condition may be suitably determined in view of the kind and thickness of the resist, and the kind and energy density of the radiant energy source.

Thereafter, the revolution speed is made 10 to 1000 rpm, in this embodiment, 400 rpm, and TMAH as the developing solution is discharged from the back rinse nozzle 107 and the not-shown development nozzle to the rear surface and the principal surface of the substrate. In this embodiment, light is kept irradiated while the developing solution is discharged.

In this embodiment, as the edge rinse method, although light is kept irradiated even during the development, the edge rinse may be made by carrying out the exposure-development operation once or plural times.

By this processing, the resist of the unnecessary portion exposed by light dissolves in the developing solution and is removed. Thereafter, the revolution speed is made 10 to 1000 rpm, in this embodiment, 400 rpm, and in order to wash the remaining developing solution, pure water is discharged to the principal surface and the rear surface of the substrate from a not-shown pure water nozzle.

The substrate subjected to the edge rinse in this way is carried in an exposure apparatus, for example, a mirror projection aligner, a proximity exposure or stepper, in this embodiment, a mirror projection aligner using the g line (having a distribution around a wavelength of 436 nm) of the mercury lamp, and light is irradiated to the resist to expose a resist pattern.

Then, the substrate is carried in a developing apparatus, for example, a spin developer, and the exposed resist is dissolved by using the developing solution (TMAH). Then, the developing solution and the resist dissolved in the developing solution are removed by washing with pure water.

After the washing, postbaking is performed at a temperature of 80 to 160° C., in this embodiment, 140° C. for 120 seconds, so that the resist pattern is formed on the amorphous silicon. A dry etching using $CF_4/O_2$ gas is performed using this resist pattern as a mask, and a pattern is formed on the amorphous silicon. Thereafter, the resist pattern is subjected to ashing by $O_2$ gas.

In this embodiment, since the edge rinse is made using the edge rinse apparatus shown in FIG. 1, the resist coated on the unnecessary portion is exposed by light similarly to the normal resist pattern and is developed by the developing solution, so that a swelling of the resist is not produced at the resist end.

In the foregoing pattern formation step, although the edge rinse was made by using the edge rinse apparatus shown in the embodiment 1, even when the edge rinse is made by using the edge rinse apparatus shown in the embodiments 2 to 4, it is possible to remove the resist of the unnecessary portion, and a swelling is not produced at the resist end.

In this embodiment, since the light source having excellent transmissivity of the resist is used, it is possible to prevent the resist residue. However, even when a combination of another radiant energy source and resist is adopted, if an exposure time or the like is suitably set, it can be used.

Besides, in this embodiment, although the amorphous silicon is used as the object to be processed, this invention is not particularly limited to this, but can be used for almost all materials, such as semiconductor, inorganic insulating film, organic resin, metal, or ceramic. However, in the case where the invention is used for a material like organic resin in which a selection ratio of a resist to an etchant is not sufficient, it is necessary to make such contrivance that a film of inorganic material, for example, silicon oxide is formed as a mask on the organic resin, and a resist pattern is formed thereon.

[Embodiment 6]

This embodiment is an example in which in a pattern formation step of an object to be processed on a substrate, an edge rinse is made by using an edge rinse apparatus having a function of coating a resist.

The edge rinse apparatus used in this embodiment has a structure in which a resist nozzle for discharging a resist to the principal surface of a substrate is provided in the edge rinse apparatus shown in FIG. 1, and which enables the edge rinse apparatus to perform resist coating as well. The edge rinse apparatus of this embodiment will be described with reference to FIG. 1 and by using the reference characters of FIG. 1.

First, a glass substrate of 126.6 mm×126.6 mm having amorphous silicon as an object to be processed is heated in a HMDS vapor up to 60° C., so that the surface is made hydrophobic, as a pretreatment for resist coating.

Then, the glass substrate is carried in the edge rinse apparatus by a not-shown conveyance means, and the substrate chuck 102 sucks and holds the substrate 101. Positioning between the glass substrate and the substrate chuck is important at the time of carrying in, and the substrate is carried in so that the substrate principal surface peripheral portion 109 is positioned outside of the substrate chuck.

A resist is discharged to the object to be processed from a not-shown resist nozzle, and the substrate chuck and the substrate are rotated, so that the resist is coated on the object to be processed. As the resist, diazonaphthoquinone-novolac resin base resist was used.

While the substrate chuck and the substrate are rotated by the motor 103 at 1 to 1000 rpm, in this embodiment, at 60 rpm, light with a wavelength of 365 nm at an energy density of 100 mW/cm$^2$ is irradiated, with the substrate chuck as a mask, from the mercury lamp as the radiant energy source 104 to the rear surface of the substrate for 15 second.

Thereafter, irradiation of light is stopped, the revolution speed is made 10 to 1000 rpm, in this embodiment, 400 rpm, and TMAH as the developing solution is discharged to the rear surface and the principal surface of the substrate from the back rinse nozzle 107 and the not-shown development nozzle. Then, the revolution speed is made 2000 to 5000 rpm, in this embodiment, 3000 rpm, and the developing solution is removed. Then, the revolution speed is again made 60 rpm, and light at an energy density of 100 mW/cm$^2$ is irradiated from the rear surface of the substrate for 15 seconds. Thereafter, the irradiation of light is stopped, the revolution speed is made 400 rpm, and the developing solution is discharged to make development, so that the edge rinse is made.

In this embodiment, since the exposure was not made during the development, the operation of exposure-development was repeated twice. However, it is also possible to make the edge rinse through one operation by elongating an exposure time, or the operation may be repeated three times or more by shortening the exposure time. Of course, as in the embodiment 5, light may be kept irradiated even during the development.

By this processing, the resist of the unnecessary portion exposed by light dissolves in the developing solution and is removed. Thereafter, the revolution speed is made 10 to 1000 rpm, in this embodiment, 400 rpm, and in order to wash the remaining developing solution, pure water is discharged from a not-shown pure water nozzle to the principal surface and the rear surface of the substrate.

The substrate subjected to the edge rinse in this way was carried in a heating furnace, prebaking at 90° C. for 90 seconds was performed to volatilize the remaining solvent in the resist, the adhesion between the resist and the object to be processed was raised, and the resist characteristics were stabilized.

Next, the substrate is carried in an exposure apparatus, for example, a mirror projection aligner, a proximity aligner, a stepper or the like, in this embodiment, a stepper using the i line (wavelength of 365 nm) of the mercury lamp, and light is irradiated to the resist to expose the resist pattern.

The exposed substrate is carried in a heating furnace, and post exposure baking (PEB) is performed at a temperature of 100 to 140° C. for 30 to 300 seconds, in this embodiment, 120° C. for 180 seconds. By this PEB, the influence of a stationary wave can be reduced. The stationary wave is liable to be generated if exposure is made by radiant energy of a single wavelength, and is formed in accordance with the thickness of the resist and the wavelength. A distribution in the exposure amount of the resist is generated by the stationary wave, and a serrated shape is formed in the pattern. In the case where the wavelength of the exposure source has a distribution as in the embodiment 5, since the influence of the stationary wave is eased, the PEB can be omitted.

Then the exposed resist is dissolved in the developing solution (TMAH) by a developing apparatus, for example, a spin developer. Then, the developing solution and the resist dissolved in the developing solution are removed by washing with pure water.

After the washing, postbaking is performed at a temperature of 80 to 160° C., in this embodiment, 120° C. for 240 seconds, and the resist pattern is formed on the amorphous silicon. A dry etching using $CF_4/O_2$ gas is performed with the resist pattern as a mask, and the amorphous silicon is patterned. After formation of the pattern, the resist pattern is subjected to ashing by $O_2$ gas.

In this embodiment, since the edge rinse apparatus shown in FIG. 1 is made to have the function of resist coating, and the edge rinse and the resist coating are continuously made, it is possible to improve the productivity. Besides, since the edge rinse apparatus shown in FIG. 1 is used, a swelling is not produced at the resist end of the resist coated on the unnecessary portion. Further, since the same resist chuck 102 is used for the resist coating and the edge rinse, there does not occur such a case that the resist rounding to the rear surface of the substrate is sandwiched between the substrate chuck and the substrate so that poor suction occurs, and the resist of the unnecessary portion can be completely removed.

In the foregoing pattern formation step, although the edge rinse apparatus in which the edge rinse apparatus shown in the embodiment 1 is made to have the function of coating resist is used, even if such a structure is adopted that the edge rinse apparatus shown in the embodiments 2 to 4 is made to have the function of coating resist, the above effects can be obtained.

Besides, in this embodiment, although the amorphous silicon on is used as the object to be processed, this invention is not particularly limited to this, but can be used for almost all materials, such as semiconductor, inorganic insulating film, organic resin, metal, or ceramic. However, in the case where the invention is used for a material like organic resin in which a selection ratio of a resist to an etchant is not sufficient, it is necessary to make such contrivance that a film of inorganic material, for example, silicon oxide is formed as a mask on the organic resin, and a resist pattern is formed thereon.

[Embodiment 7]

This embodiment is an example in which an edge rinse method described in the embodiment 5 is used in a pattern formation step when an active matrix substrate of a liquid crystal display device is fabricated. A process of fabricating the active matrix substrate will be described with reference to FIGS. 7A to 7D and FIGS. 8A to 8D.

Here, a method of fabricating a pixel TFT and a holding capacitance of a pixel portion, and an n-channel TFT and a p-channel TFT of a driving circuit provided at a peripheral portion of the pixel portion at the same time on a substrate, will be described in accordance with the process.

Figure 7A:
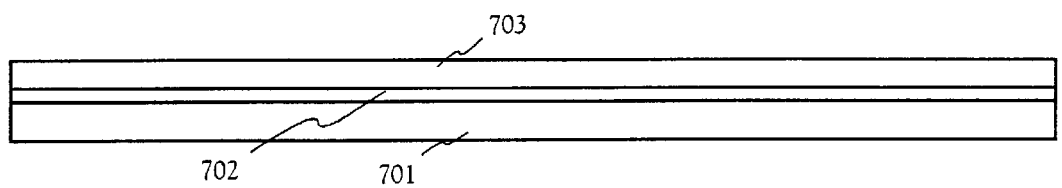
FIGS. 7A to 7D are views showing a fabricating process of an active matrix substrate of Embodiment 7.

In FIG. 7A, in addition to the glass substrates such as a barium borosilicate glass or an alumino borosilicate glass typified by the Corning glass #7059 or #1737, plastic substrates that do not have optical anisotropy such as polyethylene terephthalate (PET), polyethylene naphthalate (PEN), and polyether sulfone (PES) may be used for a substrate 701, in case of performing the crystallization and activation processes by laser annealing only. For the case of using a glass substrate, it is appropriate to perform heat treatment in advance at a temperature that is lower by approximately 10–20° C. than the distortion point of glass.

Then a base film 702 made from a film such as a silicon oxide film, a silicon nitride film, and a silicon nitride oxide film, is formed on a surface of the substrate where a TFT will be formed, in order to prevent the diffusion of impurities from the substrate. For example, a silicon nitride oxide film made from $SiH_4$, $NH_3$, and $N_2O$ at a thickness of between 10 and 200 nm (preferably between 50 and 100 nm) and similarly, a hydrogenated silicon nitride oxide film made from $SiH_4$, $N_2O$ and $H_2$ at a thickness of between 50 and 200 nm (preferably between 100 and 150 nm) are formed in lamination by plasma CVD.

The silicon nitride oxide film and hydrogenated silicon nitride oxide film are formed by using a conventional parallel plate type plasma CVD. The silicon nitride oxide film is formed by introducing $SiH_4$ into the reaction chamber at 10 SCCM, $NH_3$ at 100 SCCM, and $N_2O$ at 20 SCCM, and setting the substrate temperature to 325°° C., the reaction pressure to 40 Pa, the electric discharge power density to 0.41 W/cm², and the electric discharge frequency to 60 MHz. On the other hand, the hydrogenated silicon nitride oxide film is formed by introducing $SiH_4$ into the reaction chamber at 5 SCCM, $N_2O$ at 120 SCCM, and $H_2$ at 125 SCCM, and setting the substrate temperature to 400° C., the reaction pressure to 20 Pa, the electric discharge power density to 0.41 W/cm², and the electric discharge frequency to 60 MHZ. These films can be formed in succession by only changing the substrate temperature and changing the reaction gasses.

The silicon nitride oxide film formed here has a density of $9.28 \times 10^{22}$ /cm³, and it is a dense and hard film with an etching speed at 20° C. in a mixed solution containing 7.13% ammonium hydrogen fluoride ($NH_4HF_2$) and 15.4% ammonium fluoride ($NH_4F$) (STELLA CHEMIFA Corp; product name LAL500) which is slow at approximately 63 nm/min. If this type of film is used for the base film, then it is effective in preventing diffusion of alkaline metal elements from the glass substrate into a semiconductor layer formed on the base film.

Next, a semiconductor layer 703 having an amorphous structure is formed to a thickness of 25 to 80 nm (preferably between 30 and 60 nm) by a known method such as plasma CVD or sputtering. For example, a 55 nm thick amorphous silicon film is formed by plasma CVD. Amorphous semiconductor layers and micro crystalline semiconductor layers exist as semiconductor layers having an amorphous structure, and compound semiconductor layers having an amorphous structure, such as an amorphous silicon germanium film, may also be applied. Furthermore, both the base film and the amorphous semiconductor layer may be formed in succession. For example, after successively depositing the silicon nitride oxide film and the hydrogenated silicon nitride oxide film by plasma CVD as a base film as stated above, if the reaction gasses are changed from $SiH_4$, $N_2O$, and $H_2$ to $SiH_4$ and $H_2$, or only to $SiH_4$, then the films can be formed successively without once being exposed to the atmosphere. As a result, it becomes possible to prevent contamination of the surface of the hydrogenated silicon nitride oxide film, and fluctuation in the characteristics of the manufactured TFTs, and change in the threshold voltage thereof, can be reduced. (FIG. 7A)

Then crystallization of the amorphous silicon film is performed by laser annealing. In the crystallization step, first, it is preferable to drive out the hydrogen contained in the amorphous semiconductor film, and therefore it is desirable to perform heat treatment for approximately one hour at between 400° C. and 500° C., reducing the amount of hydrogen contained. The laser annealing uses its light source of pulse oscillation type or continuous light emitting type excimer laser or argon laser.

The laser annealing conditions may be suitably chosen by the operator, but for example, are set as follows: the excimer laser pulse oscillation frequency of 30 Hz, and a laser energy density of between 100 and 500 mJ/cm$^2$ (typically from 300 to 350 mJ/cm$^2$). The linear shape beam having the width between 100 and 1000 μm, for instance 400 μm, is then irradiated by scanning so that the overlap ratio of the linear shape beam (overlap ratio) is between 50 and 98%. Practically it is good to set the irradiation pulse number to 20 to 40 pulses. The substrate can be similarly processed even when the shape of the laser beam is formed into a planar shape.

Figure 7B:
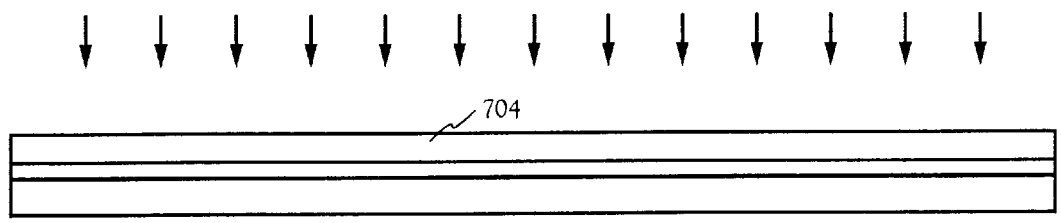

The crystalline semiconductor layer (crystalline silicon film in this Embodiment) 704 can be thus formed. (FIG. 7B)

The crystalline semiconductor layer thus formed is next formed into island-like semiconductor layers 705 to 707 having a first shape. (Pattern formation process 1)

With respect to the island-like semiconductor layers of this state, an impurity element that imparts p-type may be doped into the entire surface of the island-like semiconductor layers at a concentration of about $1 \times 10^{16}$ to $5 \times 10^{17}$ atoms/cm$^3$ in order to control the threshold voltage (Vth) of the TFT Periodic table group 13 elements such as boron (B), aluminum (Al), and gallium (Ga), etc., are known as impurity elements which impart p-type to a semiconductor. While ion implantation and ion doping can be used as the doping method, ion doping is suitable for processing a large area substrate. Boron (B) is doped here by ion doping using diborane ($B_2H_6$) as a source gas. Doping of impurity elements as such is not always necessary and there is no obstacle in omitting it, but it is a method appropriately used especially for placing the threshold voltage of the n-channel TFT within a predetermined range.

A gate insulating film 708, with a thickness of 40 to 150 nm, is formed from an insulating film containing silicon by using plasma CVD or sputtering so as to cover the island-like semiconductor layers. For example, the film may be formed at a thickness of 120 nm from the silicon nitride oxide film. Furthermore, a silicon nitride oxide film that is formed by using $SiH_4$ and $N_2O$ added with $O_2$ becomes a preferred material to be used here because the fixed electric charge density within the film has been reduced. Needless to say, the gate insulating film is not limited to this type of silicon nitride oxide film. A single layer or laminate structure may be formed from other insulating films containing silicon.

Figure 7C:
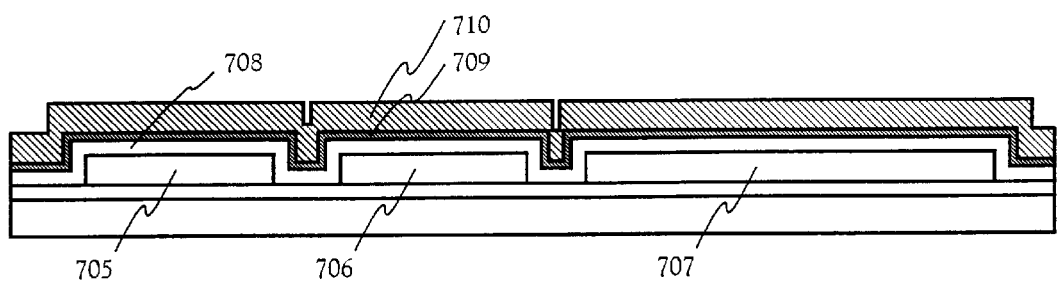

Next, a heat-resistant conductive layer is formed on the gate insulating film in order to form a gate electrode. A single layer may be formed for this heat-resistant conductive layer, but a laminate structure made up of a plurality of layers such as two layers or three layers can also be formed when necessary. For example, using such heat-resistant conductive materials, the gate electrode may be a laminate structure of a conductive layer (A) 709 made from a conductive metallic nitride film or a silicide and a conductive layer (B) 710 made from a metallic film. The conductive layer (B) may be formed from an element selected from the group consisting of tantalum (Ta), titanium (Ti), molybdenum (Mo) and tungsten (W), or from an alloy having one of these elements as its principal constituent, or from an alloy film of a combination of these elements (typically Mo—W alloy film or Mo—Ta alloy film). The conductive layer (A) is formed from tantalum nitride (TaN), tungsten nitride (WN), titanium nitride (TiN) and molybdenum nitride (MoN), etc. Further, tungsten silicide, titanium silicide and molybdenum silicide may be applied for the conductive layer (A). It is preferred that the concentration of contained impurities be reduced in order to be able to make the resistance of the conductive layer (B) lower, and in particular, it is appropriate to reduce the oxygen concentration to 30 ppm or less. For example, by reducing the oxygen concentration of W to 30 ppm or less, a resistivity value of 20 μΩcm or less can be realized with respect to W (FIG. 7C)

The conductive layer (A) may be set from 10 to 50 nm (preferably 20 to 30 nm) in thickness, and the conductive layer (B) may be from 200 to 400 nm (preferably 250 to 350 nm) in thickness. For the case of using W to form the gate electrode, a WN film of 50 nm in thickness is formed for the conductive layer (A) by introducing argon (Ar) gas and nitrogen ($N_2$) gas by sputtering using a W target and a W film of 250 nm in thickness is formed for the conductive layer (B) 111. As another method, the W film may also be formed by thermal CVD using tungsten hexafluoride ($WF_6$). In any case, it is necessary to lower the resistance for use as the gate electrode, the desired resistivity of the W film is 20 μΩcm or less. Growing larger crystal grains in the W film can lower the resistivity. However, crystallization is impeded when many impurity elements such as oxygen, exist in the W then the W film becomes high resistance. Because of this, a W target having 99.9999% degree of purity is utilized for the case of sputtering, and furthermore, sufficient consideration must be made to prevent an impurity from the vapor from mixing into the films during the deposition of the W film. Accordingly, a resistivity of between 9 and 20 μΩcm can be realized.

On the other hand, when using a TaN film for the conductive layer (A) and Ta film for the conductive layer (B), similarly both films may be formed by sputtering. The TaN film is formed using Ta as a target and a mixed gas of Ar and nitrogen as a sputtering gas. The Ta film is formed using Ar as the sputtering gas. Further, if a suitable amount of Xe or Kr is added to these sputtering gasses, then the internal stresses in the films formed can be relieved, and peeling can be prevented. The resistivity of an α-phase Ta film is about 20 μΩcm and it can be suitably used in the gate electrode, but a β-phase Ta film has a resistivity of about 180 μΩcm and it is unsuitable for the gate electrode. A TaN film possesses a crystal structure which is close to the α-phase, and therefore the α-phase Ta film can be easily obtained provided that a Ta film is formed on the TaN film. Note that although not shown in the figures, it is effective to form a silicon film doped with phosphorus (P), with a thickness of about 2 to 20 nm, below the conductive layer (A). By doing so, along with improving the adhesiveness of the conductive film formed on the silicon film and preventing oxidation, microscopic amounts of alkaline metal elements contained in the conductive layer (A) or in the conductive layer (B) can be prevented from diffusing into the gate insulating film. Whichever is done, it is preferable that the resistivity of the conductive layer (B) be in the range of 10 to 50 μΩcm.

Next, using a photomask, resist masks are formed by using the photolithography technique. Then the conductive layer (A) and the conductive layer (B) are etched together to form gate electrodes and wirings (Pattern formation process 2). The gate electrodes 711 to 713 and the capacitor wiring 714 are formed integrally from layers 711*a* to 714*a*, comprising the conductive layer (A), and from layers 711*b* to 714*b*, comprising the conductive layer (B).

Figure 7D:
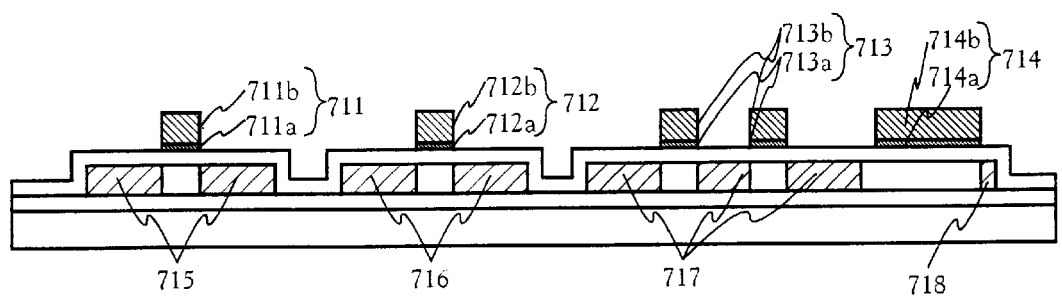

After ashing the resist masks, an impurity element that imparts n-type conductivity is doped to the semiconductor layers for the purpose of forming an LDD region of the n-channel TFTs by using the gate electrodes 711 to 713 and the capacitor wiring 714 as masks. Phosphorus (P) or arsenic (As) may be used as an impurity element that imparts n-type conductivity to a semiconductor. In order to dope phosphorus (P) here in this step, ion doping using phosphine ($PH_3$)

is adopted. The concentration of phosphorus in the formed impurity regions, low concentration n-type impurity regions 715 to 718, are in the concentration range of between $1\times10^{16}$ and $1\times10^{19}$ atoms/cm$^3$. In this Specification the concentration of the impurity element which imparts n-type, contained in the low concentration n-type impurity regions formed here, is denoted as (n$^-$). (FIG. 7D)

Figure 8A:
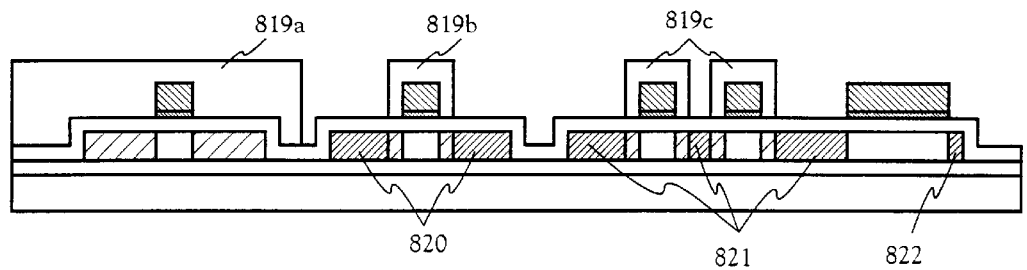
FIGS. 8A to 8D are views showing the fabricating process of the active matrix substrate of Embodiment 7.

The formation of high concentration n-type impurity regions for functioning as a source region or a drain region in the semiconductor layers 706 and 707 which form the n-channel TFTs is performed next (n$^+$ dope process). Resist masks 819*a* to 819*c* are formed by using a photomask (Pattern formation process 3), high concentration n-type impurity regions 820 to 822 are formed by adding an impurity element which imparts n-type. Phosphorus (P) is used as the impurity element which imparts n-type and ion doping is performed using phosphine (PH$_3$) so that the concentration of phosphorus in these regions is set in the concentration range of between $1\times10^{20}$ and $1\times10^{21}$ atoms/cm$^3$ (FIG. 8A).

Figure 8B:
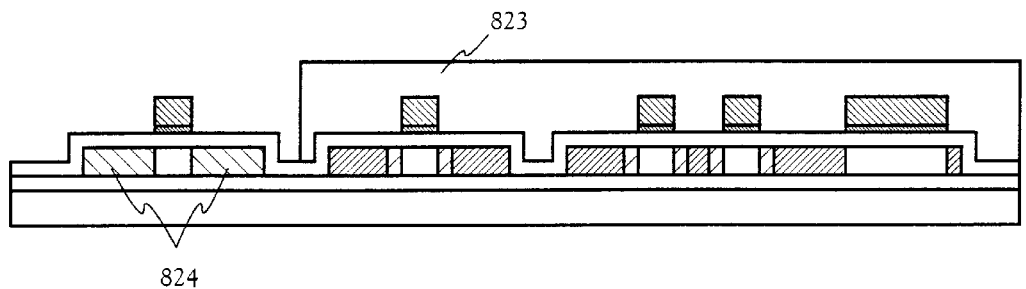

Resist masks 819*a* to 819*c* are then removed and a new resist mask 823 is formed in order to form a high concentration p-type impurity region 824 which becomes a source region and a drain region in the island-like semiconductor layer 705 which forms a p-channel TFT (Pattern formation process 4). A high concentration p-type impurity region is formed in an self-aligning manner by adding an impurity element which imparts p-type by using the gate electrode 711 as a mask. The high concentration p-type impurity region is formed by ion doping using diborane (B$_2$H$_6$). The concentration of boron (B) in this region is set at between $1\times10^{20}$ and $3\times10^{21}$ atoms/cm$^3$. Phosphorus (P) of n$^-$ is added in this high concentration p-type impurity region 824 for forming LDD regions of the n-channel TFTs, but since the boron (B) concentration added in this step is sufficiently large, it did not at all become a problem in functioning as a source region and a drain region of the p-channel TFT (FIG. 8B)

A resist mask 823 is then removed and a step of activating the impurity elements that have been added is performed. This step is performed by thermal anneal using an annealing furnace. In addition, laser annealing or rapid thermal annealing (RTA) can also be employed. Further, they may be used in combination. The thermal annealing is performed at 400° C. to 700° C., typically 500° C. to 600° C. in a nitrogen atmosphere which has an oxygen concentration of 1 ppm or less, preferably 0.1 ppm or less. Heat treatment is performed for 4 hours at 550° C. in this embodiment. Further, it is desirable to employ the laser annealing method if a plastic substrate, which has a low heat resistance temperature, is used as the substrate. When the laser annealing is adopted, a KrF excimer laser beam (wavelength 248 nm) is used, the beam is formed into linear beam and the conditions are set as follows: the excimer laser pulse oscillation frequency of 5 to 50 Hz, and a laser energy density of between 100 and 500 mJ/cm$^2$. The linear shape beam is irradiated on the entire surface of the substrate by scanning the beam so that the overlap ratio of the linear shape beam (overlap ratio) is between 80 and 98%. Note that there is no limitation to the conditions of the laser irradiation and they may be appropriately determined by the operator.

After the activation process, heat treatment is further performed at 300° C. to 450° C. for between 1 and 12 hours in an atmosphere containing between 3 and 100% hydrogen to perform a step of hydrogenating the island-like semiconductor layers. This step is for terminating the $10^{16}$ to $10^{18}$/cm$^3$ of dangling bonds in the island-like semiconductor layers by thermally excited hydrogen. In addition, plasma hydrogenation (using hydrogen excited by a plasma) may be performed as another means of hydrogenation. Further, the island-like semiconductor layers may be hydrogenated by diffusing hydrogen of the hydrogenated silicon nitride oxide film in the base film 702 by heat treatment of 300 to 450° C.

After the completion of the activation and the hydrogenation processes, an inter layer insulating film 825 is formed. The inter layer insulating film may be formed from an inorganic insulating film, or by a combination of an inorganic insulating film and an organic resin.

A silicon oxide film, a silicon nitride oxide film, a silicon nitride film or a laminate film combining these may be formed as the inorganic insulating film. In case of using a silicon oxide film here, it can be formed by plasma CVD, by mixing tetraethyl orthosilicate (TEOS) and O$_2$, setting the reaction pressure 40 Pa, the substrate temperature at 300 to 400° C., and performing discharge at high frequency (13.56 MHZ) power density of 0.5 to 0.8 W/cm$^2$. In case of using a silicon nitride oxide film, a silicon nitride oxide film formed by plasma CVD from SiH$_4$, N$_2$O and NH$_3$ or a silicon nitride oxide film manufactured from SiH$_4$ and N$_2$O may be formed. The manufacturing conditions in this case is reaction pressure between 20 and 200 Pa, the substrate temperature between 300 and 400° C., and the film can be formed at the high frequency (60 MHZ) power density of 0.1 to 1.0 W/cm$^2$. Further, a hydrogenated silicon nitride oxide film manufactured from SiH$_4$, N$_2$O and H$_2$ may also be adopted. It is possible to form a silicon nitride film similarly by plasma CVD from SiH$_4$ and NH$_3$.

Polyimide, acrylic, polyamide, polyimideamide, BCB (benzocyclobutene), etc., can be used as the organic resin. For example, in case of using polyimide of the type which thermally polymerizes after coated to the substrate is used, it is formed by firing at 300° C. in a clean oven. Further, in case of using acrylic, 2 solution type is used, the main agent and the curing agent are mixed, the film is formed by coating the agent onto the entire surface of the substrate by using a spinner, performing a preparatory heating with a hot plate at 80° C. for 60 seconds and firing in a clean oven at 250° C. for 60 minutes.

In this Embodiment a silicon oxide film of 100 to 200 nm thickness is formed as an inter layer insulating film 825*a* comprising an inorganic insulating film and a polyimide having average thickness of 1.0 to 2.0 μm is formed as an inter layer insulating film 825*b* comprising an organic resin.

The surface can be excellently planarized by forming the inter layer insulating film from an organic resin. Further, the parasitic capacitance can be reduced because the organic resin has a low dielectric constant in general. However, an organic resin has a moisture absorbing characteristic and is not appropriate for the protective film, it is necessary to use in combination with an inorganic insulating film.

Figure 8C:
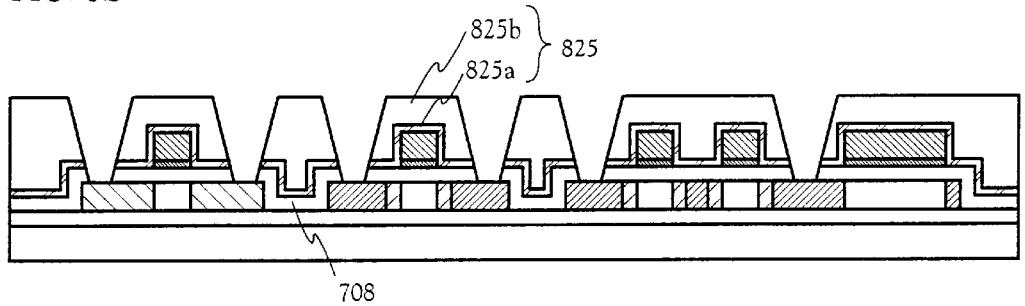

A predetermined patterned resist mask is formed next by using a photomask, and contact holes that reach the source regions and the drain regions formed by the respective island-like semiconductor layers are formed (Pattern formation process 5). These contact holes are formed by means of dry etching. In this case, first the inter layer insulating film 825*b* made of an organic resin is etched using a gaseous mixture of CF$_4$, O$_2$, and He as etching gas, and then the inter layer insulating film 825*a* comprising inorganic insulating film is etched with CF$_4$ and O$_2$ as etching gas. Furthermore, in order to raise the selective ratio with the island-like semiconductor layer, the etching gas is switched to CHF$_3$ to etch the gate insulating film 708 whereby a contact hole can be nicely formed. (FIG. 8C)

A conductive metallic film is formed next by sputtering or vacuum evaporation. Then a resist mask pattern is formed by using a photomask and then etched to thereby form source wirings 826 to 828 and drain wirings 829 to 831 (Pattern formation process 6). The drain wiring 831 here is for functioning as the pixel electrode. Although not shown in the figures, in this embodiment, these electrodes are formed such that a Ti film is formed at a thickness of between 50 and 150 nm, a contact is formed with a semiconductor film that forms the source or the drain region of the island-like semiconductor layer, and an aluminum (Al) film is formed at a thickness of between 300 and 400 nm on the Ti film overlapping thereon.

Figure 8D:
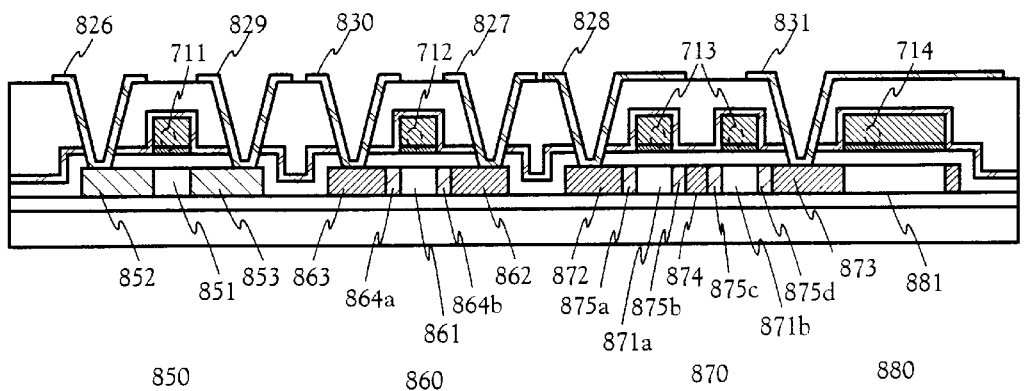
Figure 9:
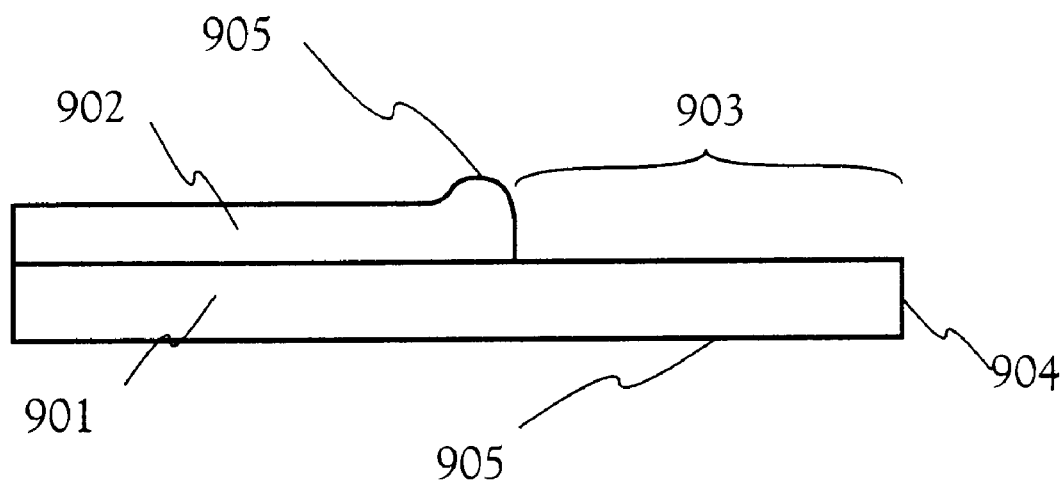
FIG. 9 is a view showing a state of a resist after a conventional edge rinse is made.

When hydrogenating treatment was carried out in this state, a preferable result for improvement of characteristics of a TFT was obtained. For example, it is appropriate that a heat treatment at 300 to 450° C. for 1 to 12 hours is carried out in an atmosphere containing hydrogen of 3 to 100%, or even when a plasma hydrogenating method is used, a similar effect is obtained. Besides, by such a heat treatment, it is also possible to diffuse hydrogen existing in the inorganic insulating film 825a or the under film into the island-like semiconductor layers 705 to 707 and to make hydrogenation. In any event, it is desirable that the defect density in the island-like semiconductor layer is made $10^{16}/cm^3$ or less, and for that purpose, it is sufficient that hydrogen of about $5\times10^{18}$ to $5\times10^{19}$ atoms/$cm^3$ was added. In the island-like semiconductor layer subjected to such treatment, slightly existing crystal grains became inactive, and a region which is regarded substantially as single crystal is formed (FIG. 8D).

In this way, it is possible to complete the substrate in which the TFTs of the driving circuit and the pixel TFT of the pixel portion are provided on the same substrate. A p-channel TFT 850 and an n-channel TFT 860 are formed in the driving circuit, and a pixel TFT 870 and a holding capacitance 880 are formed in the pixel portion. In this specification, for convenience, such a substrate is called an active matrix substrate.

The p-channel TFT 850 of the driving circuit has a single drain structure including the channel formation region 851 provided in the island-like semiconductor layer 705 through the gate electrode 711 and the gate insulating film, the source region 852 and the drain region 853 made of the high concentration p-type impurity region.

The n-channel TFT 860 includes the channel formation region 861 provided in the island-like semiconductor layer 706 through the gate electrode 712 and the gate insulating film, the source region 862 and the drain region 863 made of the high concentration n-type impurity region, and the LDD regions 864a and 864b made of the low concentration n-type impurity region. The length of the LDD region in the channel length direction is 0.5 to 4.0 µm, preferably 1.5 to 2.5 µm.

The pixel TFT 870 includes the channel formation regions 871a and 871b provided in the island-like semiconductor layer 707 through the gate electrode 713 and the gate insulating film, the source region 872 and the drain regions 873 and 874 made of the high concentration n-type impurity region, and the LDD regions 875a to 875d made of the low concentration n-type impurity region. The length of the LDD region (Loff) in the channel length direction is 0.5 to 4.0 µm, preferably 1.5 to 2.5 µm. Further, the holding capacitance 880 is formed of the capacitance wiring line 714, the insulating film made of the same material as the gate insulating film, and the semiconductor layer 881 connected to the drain region 873 of the pixel TFT.

In FIG. 8D, although the pixel TFT 870 is made to have a double gate structure, a single gate structure may be adopted, or a multigate structure in which plural gate electrodes are provided may be adopted.

Further, the gate electrode is formed of the conductive material having heat resistance, so that activation of the LDD region, source region, and drain region is facilitated. A high quality display device can be realized by such an active matrix substrate. A reflection type liquid crystal display device can be fabricated from the active matrix substrate fabricated in this embodiment.

In the fabrication process of the active matrix substrate of this embodiment, and in the step of forming the conductive layer (A) and the conductive layer (B), and the step of forming conductive film of the source wiring line or drain wiring line, a shield (for example, made of metal or ceramic) is provided at the peripheral portion of the principal surface of the substrate on a substrate support of a film formation apparatus, so that the conductive layer (A), the conductive layer (B) and the conductive film are not formed on the peripheral portion of the principal surface of the substrate.

In the foregoing fabricating process of the active matrix substrate, it is necessary to carry out six pattern formation steps. In any of the pattern formation steps 1 to 6, the edge rinse method described in the embodiment 5 can be used, and by using the edge rinse method described in the embodiment 5, it was possible to improve the yield.

In this embodiment, although the edge rinse method described in the embodiment 5 is used in the pattern formation step, even when the edge rinse method described in the embodiment 6 is used, the yield can be improved.

Besides, in this embodiment, although the edge rinse apparatus and the edge rinse method of the present invention are used for the pattern formation step in the fabricating process of the active matrix substrate, it is also effective to use them in a pattern formation step at the time of fabrication of other display devices, an image sensor, or a circuit of combination of semiconductor components provided on a substrate transmitting radiant energy.

As described above, according to the present invention, similarly to a normal pattern formation, an edge rinse is made by the processing of exposure and development, so that a swelling of an end portion of a resist can be prevented, raising dust or wastes can be eliminated, and high yield can be obtained.

Besides, since the resist of an unnecessary portion is removed by using a developing solution, it is possible to prevent poor pattern formation due to splashing of a washing solution, which conventionally occurs. Further, it becomes unnecessary to use a washing solution, so that the kinds of used chemicals can be decreased.

What is claimed is:

1. A method for edge rinsing a substrate being coated with a resist, said method comprising the steps of:
   exposing the resist from a rear surface of the substrate with a substrate chuck as a mask; and
   developing the exposed resist.

2. A method for edge rinsing a substrate being coated with a resist, said method comprising the steps of:
   discharging a developing solution to a rear surface and a principal surface of the substrate while exposing the resist from the rear surface of the substrate using a substrate chuck as a mask, and developing the exposed resist.

3. A method according to claim 1,
   wherein the method for edge rinsing is performed in an edge rinse apparatus, said edge rinse apparatus comprising:
  a substrate chuck for sucking and holding a substrate;
  a motor for rotating the substrate chuck;
  a first nozzle for discharging a developing solution to a principal surface of the substrate;
  a second nozzle for discharging the developing solution to a rear surface of the substrate; and
an exposure means for exposuring with the substrate chuck as a mask.

4. A method according to claim 1,
wherein the method for edge rinsing is performed in an edge rinse apparatus,
said edge rinse apparatus comprising:
  a substrate chuck for sucking and holding a substrate;
  a motor for rotating the substrate chuck;
  a first nozzle for discharging a developing solution to a principal surface of the substrate;
  a second nozzle for discharging the developing solution to a rear surface of the substrate;
  a radiant energy source; and
  a transmission window for transmitting a radiant energy from the radiant energy source there through.

5. A method according to claim 1,
wherein the method for edge rinsing is performed in an edge rinse apparatus,
said edge rinse apparatus comprising:
  a substrate chuck for sucking and holding a substrate;
  a motor for rotating the substrate chuck;
  a first nozzle for discharging a developing solution to a principal surface of the substrate;
  a second nozzle for discharging the developing solution to a rear surface of the substrate;
  a radiant energy source; and
  a reflecting mirror for reflecting a radiant energy from the radiant energy source.

6. A method according to claim 1,
wherein the method for edge rinsing is performed in an edge rinse apparatus,
said edge rinse apparatus comprising:
  a substrate chuck for sucking and holding a substrate;
  a motor for rotating the substrate chuck;
  a first nozzle for discharging a developing solution to a principal surface of the substrate;
  a second nozzle for discharging the developing solution to a rear surface of the substrate;
  a radiant energy source; and
  an optical fiber having a cut,
    wherein the optical fiber transmits a radiant energy from the radiant energy source.

7. A method according to claim 1,
wherein the method for edge rinsing is performed in an edge rinse apparatus,
said edge rinse apparatus comprising:
  a substrate chuck for sucking and holding a substrate;
  a motor for rotating the substrate chuck;
  a first nozzle for discharging a developing solution to a principal surface of the substrate;
  a second nozzle for discharging the developing solution to a rear surface of the substrate; and
  a radiant energy source,
    wherein the substrate chuck includes a waveguide for a radiant energy from the radiant energy source therein.

8. A method according to claim 2,
wherein the method for edge rinsing is performed in an edge rinse apparatus
said edge rinse apparatus comprising:
  a substrate chuck for sucking and holding a substrate;
  a motor for rotating the substrate chuck;
  a first nozzle for discharging a developing solution to a principal surface of the substrate;
  a second nozzle for discharging the developing solution to a rear surface of the substrate; and
an exposure means for exposuring with the substrate chuck as a mask.

9. A method according to claim 2,
wherein the method for edge rinsing is performed in an edge rinse apparatus,
said edge rinse apparatus comprising:
  a substrate chuck for sucking and holding a substrate;
  a motor for rotating the substrate chuck;
  a first nozzle for discharging a developing solution to a principal surface of the substrate;
  a second nozzle for discharging the developing solution to a rear surface of the substrate;
  a radiant energy source; and
  a transmission window for transmitting a radiant energy from the radiant energy source there through.

10. A method according to claim 2,
wherein the method for edge rinsing is performed in an edge rinse apparatus,
said edge rinse apparatus comprising:
  a substrate chuck for sucking and holding a substrate;
  a motor for rotating the substrate chuck;
  a first nozzle for discharging a developing solution to a principal surface of the substrate;
  a second nozzle for discharging the developing solution to a rear surface of the substrate;
  a radiant energy source; and
  a reflecting mirror for reflecting a radiant energy from the radiant energy source.

11. A method according to claim 2,
wherein the method for edge rinsing is performed in an edge rinse apparatus,
said edge rinse apparatus comprising:
  a substrate chuck for sucking and holding a substrate;
  a motor for rotating the substrate chuck;
  a first nozzle for discharging a developing solution to a principal surface of the substrate;
  a second nozzle for discharging the developing solution to a rear surface of the substrate;
  a radiant energy source; and
  an optical fiber having a cut,
    wherein the optical fiber transmits a radiant energy from the radiant energy source.

12. A method according to claim 2,
wherein the method for edge rinsing is performed in an edge rinse apparatus,
said edge rinse apparatus comprising:
  a substrate chuck for sucking and holding a substrate;
  a motor for rotating the substrate chuck;
  a first nozzle for discharging a developing solution to a principal surface of the substrate;
  a second nozzle for discharging the developing solution to a rear surface of the substrate; and
  a radiant energy source.
    wherein the substrate chuck includes a waveguide for a radiant energy from the radiant energy source therein.

* * * * *